United States Patent [19]

Carlsen, II

[11] 4,253,070
[45] Feb. 24, 1981

[54] FEEDBACK ARRANGEMENT

[75] Inventor: George D. Carlsen, II, Redondo Beach, Calif.

[73] Assignee: Dynamic Compliance, Incorporated, Santa Monica, Calif.

[21] Appl. No.: 36,050

[22] Filed: May 4, 1979

[51] Int. Cl.³ .......................... H03F 3/45; H03F 1/08
[52] U.S. Cl. ................................. 330/260; 330/79; 330/105; 330/293
[58] Field of Search ................. 330/260, 293, 79, 105

[56] References Cited

U.S. PATENT DOCUMENTS

| | | | |
|---|---|---|---|
| 1,183,875 | 5/1916 | Hartley | 330/105 |
| 2,239,830 | 4/1941 | Rankin | 330/79 |
| 2,273,619 | 2/1942 | Bruck | 330/105 |
| 3,368,159 | 2/1968 | Richman | 330/79 |
| 3,435,133 | 5/1969 | Gibson | 330/79 |
| 3,885,219 | 5/1975 | Vaughn | 330/260 |

*Primary Examiner*—Harold A. Dixon
*Attorney, Agent, or Firm*—Kenneth W. Float

[57] ABSTRACT

An arrangement to provide feedback to amplifier systems incorporating an electrical load. A current transformer in conjunction with a resistor is incorporated to provide a feedback correction signal to an amplifier which corrects for distortion caused by both the amplifier and the inductive load. A first embodiment provides a single-ended amplifier driving a load and incorporates the current transformer between the output of the amplifier and the load. The secondary winding of the transformer is in series with the input to the amplifier, and a resistor is connected across the secondary winding. The transformer determines the frequency bandwidth of the entire amplifier system, and the resistor value determines the gain of the amplifier. Such a configuration provides negative feedback to the amplifier which is directly proportional to changes in current in the load due to distortions caused by the amplifier or load. The second embodiment applies the principles of the present invention to a differential amplifier configuration. The primary winding of the current transformer is connected between the output of the amplifier and one end of the load. A secondary winding of the transformer is connected to the other end of the load and to the negative input of the differential amplifier. A resistor is connected across the secondary winding of the transformer.

3 Claims, 3 Drawing Figures

FEEDBACK ARRANGEMENT

BACKGROUND OF THE INVENTION

The present invention relates generally to amplifier systems, and more particularly to a feedback arrangement for correcting distortions in the amplifier system.

Generally, audio amplifiers, or the like, are designed to amplify an input signal and apply it to a load with a minimum amount of distortion. In systems using inductive loads, for example, a back EMF or voltage is generated by the load which is proportional to the inductance of the load times the rate of change of the current through the load. In general, most conventional amplifier systems used to drive inductive loads have been unable to do so without introducing distortion into the output signal. This distortion is due to the time varying back EMF change which either boosts or reduces the output signal, thus introducing the distortion.

One prior attempt to correct for distortion in inductive loads utilizes a fixed filter arrangement to provide a predistorted signal in the load. If the distortion characteristics of the load are known, the predistorted signal is shaped so as to interact with the load to produce an undistorted signal in a manner analogous to the concept of destructive interference. However, this approach produces acceptable results only over a limited frequency range. The approach is unacceptable when used with devices such as shaker table drivers, magnetostrictive devices, and loudspeakers, or the like, which operate over a wide frequency in harmonic ranges, and which are subject to varying loads over their operating ranges. Also, distortion in recording systems such as magnetic tape phonograph discs, or the like, may not be corrected by such prior art systems.

For example, many prior art systems have attempted to correct for distortion in amplifier systems incorporating loudspeakers. Many factors affect the distortion-free performance of the loudspeaker including speaker cone mass, air resistance, and self-resonances. Nonlinearities introduced by these speaker properties result in changes in the back EMF of the speaker which boosts or reduces the amplifier output signal, producing unwanted distortion.

Prior attempts to correct for distortion include various types of sensors in the speaker to detect speaker motion. Typical of these sensors are light beam systems, extra voice coils, and tapped voice coils. The sensors generate error signals by comparing signals proportional to the speaker motion and the amplifier input signal, and applying the error signals to the amplifier in a feedback arrangement. Typical of prior art systems utilizing feedback are U.S. Pat. No. 2,358,630, issued Sept. 19, 1944, for "Amplifier System"; and U.S. Pat. No. 3,656,831, issued Apr. 18, 1972, for "Feedback Amplifier."

Additionally, many prior art systems have incorporated transformers to either isolate the load from the amplifier or to provide voltage feedback to the amplifier in an attempt to correct for distortion caused by the amplifier and generally not by the load. Typical of such systems include U.S. Pat. No. 1,519,211, issued on Dec. 16, 1924 for "Loudspeaker Circuit"; U.S. Pat. No. 2,302,493, issued Nov. 17, 1942 for "Amplifying System"; U.S. Pat. No. 2,358,630, issued Sept. 19, 1944 for "Amplification System"; U.S. Pat. No. 2,383,867, issued Aug. 28, 1945 for "Power Output Amplifier Circuit"; U.S. Pat. No. 2,922,846, issued Jan. 26, 1960 for "Audio Amplifier System"; and U.S. Pat. No. 3,656,831, issued Apr. 18, 1972 for "Feedback Amplifier."

Generally, many of the prior art systems include many components which add to the system complexity, cost and reduced reliability. Also, those systems incorporating error-sensing resistors or the like generally have power losses associated with them due to the incorporation of the resistors.

SUMMARY OF THE INVENTION

Accordingly, it is an object of the present invention to provide a feedback arrangement which corrects for distortion in amplifier systems driving an electrical load.

A further object of the present invention is to provide a feedback arrangement which contributes substantially no power loss to the system, and which controls both the frequency bandwidth of the amplifier system and the gain of the amplifier.

In accordance with these and other objects of the present invention, there is provided a feedback arrangement for correcting distortion in an amplifier system driving an electrical load. The arrangement generally comprises an amplifier, a load, and a feedback circuit including a current transformer and a resistor. The circuit contributes substantially no power loss to the overall amplifier system while additionally controlling the frequency bandwidth of the amplifier system and the gain of the amplifier.

A first embodiment comprises an amplifier having an input and an output and a load having one end connected to the output of the amplifier and the other end connected to an electrical ground. A current transformer has its primary winding connected between the output of the amplifier and the one end of the load. The secondary winding of the current transformer is connected in series with the input to the amplifier, and a resistor is connected across the secondary winding.

A second embodiment provides a differential amplifier having first and second inputs and an output and a load connected between the output of the amplifier and an electrical ground. A current transformer has its primary connected between the output of the amplifier and the one end of the electrical load, while the secondary winding of the current transformer is connected between the negative input to the differential amplifier and the electrical ground. Additionally, a resistor is connected across the secondary winding of the current transformer.

BRIEF DESCRIPTION OF THE DRAWINGS

The foregoing and other objects and features of the present invention may be more readily understood with reference to the following detailed description taken in conjunction with the accompanying drawings, wherein like reference numerals designate like structural elements, and in which.

DETAILED DESCRIPTION

Figure 1:
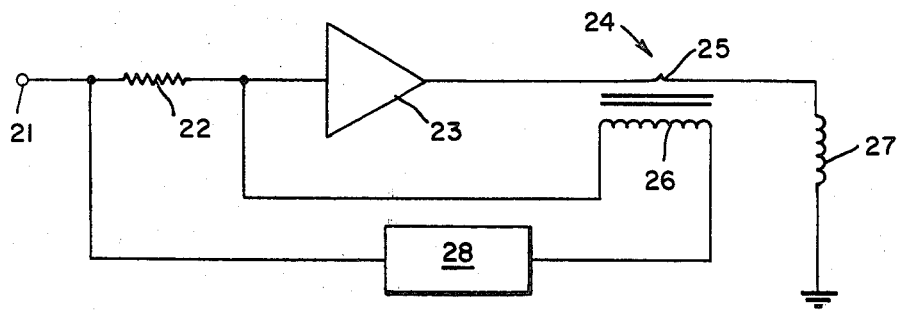
FIG. 1 shows a single input amplifier system made in accordance with the principles of the present invention.

Referring to FIG. 1, there is shown an amplifier system including an input terminal 21 which is connected in series with a resistor 22 to an input to an amplifier 23. The output of the amplifier 23 is connected in series with a primary winding 25, a current transformer 24, which, in turn, is connected in series to a load 27 and hence to electrical ground. A secondary winding 26 of the current transformer 24 is also connected in series with the input terminal 21 to the amplifier system and the input to the amplifier 23. In addition, a response-tailoring circuit 28 may be connected in series with the secondary winding 26 of the current transformer 24.

Generally, current transformers are well-known in the art and typically comprise a primary winding having one turn through which is passed high current. The secondary winding has many turns and conducts very little current. Incorporation of a resistor across the secondary allows for a low voltage, low current signal which is responsive to changes or fluctuations in the primary current.

In operation of the embodiment of FIG. 1, input signals are applied to the terminal 21 and hence are amplified by the amplifier 23 and applied to the load 27. The secondary winding 26 of the current transformer 24 responds to changes in current passing through the primary 25 which are due to perturbations or distortions caused by the load 27 or the amplifier 23. The current induced in the secondary winding 26 is fed back to the input of the amplifier 23. The signals fed back to the input are directly proportional to the current flowing through the load 27. The polarity of the secondary winding 26 is chosen so as to provide negative feedback signals to the input of the amplifier 23, which cancel unwanted distortion and perturbation after amplification of the feedback signals.

The frequency bandwidth of the amplifier system is essentially determined by the turns ratio of the transformer 24. Generally, the primary winding 25 has a single turn, while the secondary winding has many turns (say 300 or 1,000, for example), and this turns ratio determines the low frequency roll-off of the system frequency bandwidth. Additional filtering is available by means of the response-tailoring circuit 28, which may include various resistors and capacitors. Additionally, the resistor 22 determines the overall gain of the amplifier 23.

Figure 2:
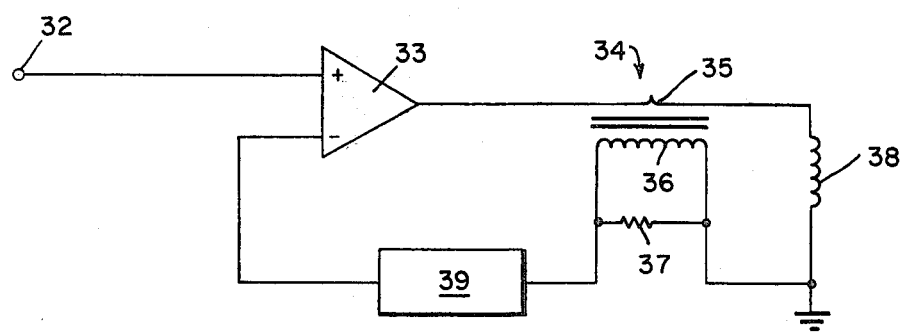
FIG. 2 shows a differential amplifier system made in accordance with the present invention.

Referring now to FIG. 2, there is shown a differential amplifier system made in accordance with the present invention. An input terminal 32 is connected to the positive input of differential amplifier 23. The output of the differential amplifier 33 is connected in series with a primary winding 35 of a current transformer 34 and hence in series with a load 32 to ground. A secondary winding 36 of the current transformer 34 has one end thereof connected to ground and the other end connected in series with a response-tailoring circuit 39 and hence to a negative input of the differential amplifier 33. A resistor 37 is connected across the secondary winding 36.

The operation of the differential amplifier system is substantially the same as the amplifier system of FIG. 1 except that, since the differential amplifier 33 essentially sums the signals provided at the positive and negative input terminals thereof, the polarity of secondary winding 36 is chosen so as to have the same polarity as signals provided at the positive terminal of the differential amplifier 33.

Figure 3:
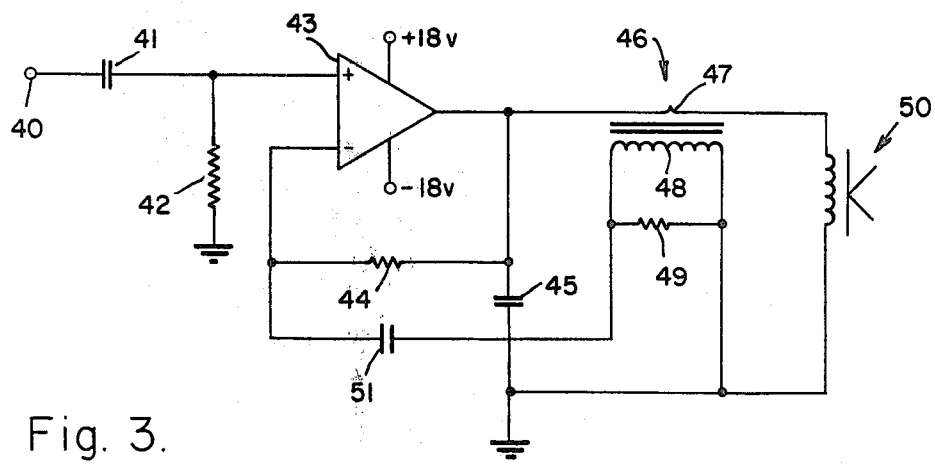
FIG. 3 shows an audio power amplifier/speaker system which was built and tested in order to prove the concepts of the present invention.

FIG. 3 shows a specific embodiment of the present invention which was built, operated and tested to prove out the principles of the present invention. An input terminal 40 is connected in series with a capacitor 41 to a positive input to a differential amplifier 43. A resistor 42 is also connected from the positive input to the differential amplifier 43 to ground. The output of the differential amplifier 43 is connected in series with a primary winding 47 of a current transformer 46 to a speaker 50 and hence to ground. A secondary winding 48 of the current transformer 46 has one end thereof conneced to ground and the other end thereof connected in series with a capacitor 51 and hence to the negative input terminal of the differential amplifier 43. A resistor 49 is connected across secondary winding 48 of the current transformer 46. The output of the differential amplifier 43 is also connected in series to a capacitor 45 and hence to ground and also to a resistor 44 to the negative input terminal of the differential amplifier 43.

The specific components and values thereof as used in the amplifier system of FIG. 3 are as follows. The differential amplifier 43 is a model TDA-22, 20-watt monolithic integrated operational amplifier manufactured by SGS-ATES, Inc.; capacitor 41 is 0.22 microfards; resistor 42 is 100,000 ohms; resistor 44 is 100,000 ohms; capacitor 45 is 0.1 microfarads; capacitor 51 is 4.7 microfarads; resistor 49 is 35 ohms; the speaker is 4 ohms; and the current transformer 46 has a single turn in the primary winding 47 and 308 turns in the secondary winding 48.

The differential amplifier 43 was operated at ±18 volts. Input signals to the input terminal 40 were at 0.25 volts RMS, and the output was 20 watts RMS into the 4 ohm load. The frequency response was 20 hertz to 20 kilohertz at 0.5 dB points. The value of resistor 49 was selected such that the RMS feedback voltage was equal to the amplifier input RMS voltage at full power and rated load.

The present invention was incorporated in several televisions and radios manufactured by a reputable manufacturer of these devices for the purposes of demonstrating the enhanced performance of these amplifier/speaker systems when using the concepts of the present invention. A switch was provided on each of the systems tested which allowed for the present invention to be switched "in" or switched "out" of each system. Numerous people listened to these systems with and without the present invention and concluded that, based on these listening-type tests, the present invention provided a marked improvement over such systems that did not incorporate the present invention.

Additionally, the world's supply of cobalt which is used in the manufacture of Alnico magnets, commonly used in most speaker systems, is rapidly being depleted. The Alnico-type magnet provides for much less distortion and much cleaner performance in speakers in which they are incorporated. However, incorporating the present invention in such amplifier/speaker systems would allow for the use of speakers which incorporate conventional iron magnets instead of Alnico magnets. Incorporation of the present invention in such amplifier/speaker systems would reduce their overall cost, while enhancing the overall performance characteristics of the system.

Thus, there has been provided feedback arrangement which corrects for distortions in amplifier systems driving electrical loads. The feedback arrangement corrects for distortions or perturbations caused by either the load or the amplifier. The arrangement allows for simple control of the overall system frequency bandwidth and the amplifier gain. The feedback arrangement may be used with any amplifier and any load, whether it be inductive, capacitive or resistive.

It is to be understood that the above-described embodiments of the present invention are merely illustrative of the many specific embodiments which are applications of principles of the present invention. Numerous and varied other arrangements may be readily devised in accordance with these principles by those skilled in the art, without departing from the spirit and scope of the present invention.

What is claimed is:

1. Apparatus comprising:
   an amplifier having first and second inputs and an output;
   a load having one end connected to said output and the other end connected to an electrical ground;
   a current transformer having a primary winding and a secondary winding, said primary winding being connected between said one end of said load and said output, said secondary winding being connected between said electrical ground and said second input of said amplifier; and
   a resistor connected across said secondary winding of said transformer.

2. Apparatus comprising:
   an amplifier having first and second inputs and an output, said first input being adapted to receive input signals;
   a load having one end connected to said output and the other end connected to an electrical ground;
   a current transformer having a primary winding and a secondary winding, said primary winding being connected between said output and said one end of said load, said secondary winding being connected between said electrical ground and said second input of said amplifier; and
   a resistor connected across said secondary winding of said transformer;
   said transformer being adapted to provide negative feedback signals to said second input of said amplifier which are indicative of changes in the current flowing through said load, said feedback signals being directly proportional to the current flowing through said load, such feedback being obtained with substantially no power loss, said transformer being determinative of the frequency bandwidth of said apparatus, and said resistor being determinative of the gain of said amplifier; whereby said transformer and said resistor provide negative feedback signals to said amplifier which correct for distortions in signals applied to said load, caused by said amplifier and said load.

3. Apparatus comprising:
   an amplifier having an input and an output;
   a load having one end connected to said output and the other end connected to an electrical ground;
   a transformer having a primary winding and a secondary winding, said primary winding being connected between said output and said one end of said load, said secondary winding being connected in series with said input of said amplifier; and
   a resistor connected across said secondary winding of said transformer.

* * * * *